United States Patent [19]

Nakada et al.

[11] Patent Number: 4,956,070

[45] Date of Patent: Sep. 11, 1990

[54] SPUTTERING APPARATUS

[75] Inventors: Junji Nakada; Hideaki Takeuchi, both of Kanagawa, Japan

[73] Assignee: Fuji Photo Film Co., Ltd., Kanagawa, Japan

[21] Appl. No.: 338,078

[22] Filed: Apr. 14, 1989

[30] Foreign Application Priority Data

Apr. 20, 1988 [JP] Japan .................................. 63-95430

[51] Int. Cl.$^5$ .............................................. C23C 14/35
[52] U.S. Cl. ............................ 204/298.18; 204/298.08
[58] Field of Search ...................... 204/192.12, 298 PS, 204/298 PM, 298 SG

[56] References Cited

FOREIGN PATENT DOCUMENTS

| 61-41767 | 2/1986 | Japan | 204/298 SG |
|---|---|---|---|
| 61-44176 | 3/1986 | Japan | 204/298 SG |
| 61-250166 | 11/1986 | Japan | 204/298 SG |
| 62-17175 | 1/1987 | Japan | 204/298 SG |
| 62-33764 | 2/1987 | Japan | 204/298 SG |
| 62-179115 | 8/1987 | Japan | 204/298 PM |
| 63-71878 | 7/1988 | Japan | 204/298 SG |
| 63-227779 | 9/1988 | Japan | 204/298 SG |

Primary Examiner—Aaron Weisstuch
Attorney, Agent, or Firm—Sughrue, Mion, Zinn, Macpeak & Seas

[57] ABSTRACT

A plural-cathode sputtering apparatus capable of producing mixed thin films having a period of stratification as small as 10 Å without putting an undue load on the power supplies. Two different types of targets are provided on a cathode side, and a substrate onto which sputtering is performed is provided on the anode side. Magnetic field generators produce magnetic fields substantially perpendicularly intersecting the electric fields generated between the plate and the targets near and front sides of the targets. The magnetic field generators are each composed of main magnets and electromagnets, which may be combined with the main magnets. Electrical currents are produced for exciting the electromagnets which are controlled in such a manner as to change the magnetic intensity of the magnetic fields and to thereby regulate the sputtering discharge.

5 Claims, 4 Drawing Sheets

SPUTTERING APPARATUS

BACKGROUND OF THE INVENTION

The present invention relates to an apparatus for manufacturing a thin film by sputtering, and more particularly relates to a magnetron-type sputtering apparatus capable of controlling the speed of deposition of a thin film.

In a conventional sputtering apparatus, glow discharge is caused in a low-pressure atmosphere of argon or the like, and plasma ions are made to collide against a cathode target to dislodge atoms from the target, which are then deposited on a base plate facing the target. Particularly, in a magnetron sputtering apparatus, a magnetic field is generated which is substantially parallel to a cathode target and which perpendicularly intersects the electric field. In such an apparatus, the speed of deposition of the thin film is high, and damage to the base plate on which the film is deposited and a rise in the temperature of the plate are prevented. Due to these advantages, magnetron sputtering apparatuses have been widely used.

A conventional magnetron-type sputtering apparatus includes a magnetic field generator having a permanent magnet or an electromagnet disposed near the rear side of the cathode target.

A plural-cathode sputtering apparatus, with which a thin mixture film can be manufactured while the composition of the film is controlled, has recently been disclosed. FIG. 4 shows a schematic view of a major part of such an apparatus, in which targets 41A and 41B differing from each other in material are provided. Permanent magnets 42A and 42B corresponding in shape to the targets IA and IB are provided at the rear sides thereof with which tunnel-shaped closed magnetic fields Xa are generated on the front sides of the targets by the north and south poles of the magnets. At the time of sputtering discharge, plasma electrons are trapped in the tunnel-shaped closed magnetic fields and ionization is promoted in the plasma to increase the speed of sputtering. Substrates 6, on which the films are deposited, are disposed on a holder 7.

In a method of depositing thin mixture films each composed of mutually different stratified atomic layers, shutters 45A and 45B provided in front of the targets 41A and 41B are selectively opened and closed and the holder 7 is rotated to deposit the thin mixture films. Voltages applied to the targets 41A and 41B from target power supplies 44A and 44B are maintained at desired levels. However, since the depth of stratification of each layer of the thin mixture film is mechanically limited by the speed of opening and closing of the shutters 45A and 45B, it is impossible to deposit a thin mixture film having a period of stratification (stratification depth) of about 10 521 to several scores of 10 Å. In other words, it is impossible to make the thickness of each layer of such a film smaller using such a method.

In another method of depositing thin mixture films, independent power supplies 44A and 44B are provided for the targets 41A and 41B, and the lengths of time of application of voltages to the targets from the power supplies are controlled independently of each other to selectively change the lengths of time of discharge on the targets. In the latter method, thin mixture films of optional stratification can be deposited by changing the lengths of time of application of the voltages to the targets 41A and 41B. However, changing the lengths of time of application of the voltages can lead to damage to the power supplies 44A and 44B, as will be described below in more detail.

When the voltages are applied to the targets 41A and 41B, the change in the impedance before the generation of the plasma is so large that a large surge current flows. Therefore, if the period of application and removal of the voltage is short, not only is an undesirable sputtering discharge disturbance caused by the transient surge current, but also various components of the power supplies 44A and 44B tend to overheat, leading to damage. For that reason, the period of application and removal of the voltages to the targets 41A and 41B is limited by the performance of the power supplies 44A and 44B, again preventing the deposition of a thin mixture film, having a period of stratification as small as 10 Å to several scores of 10 Å.

SUMMARY OF THE INVENTION

The present invention was made in order to solve the above-mentioned problems.

Accordingly, it is an object of the present invention to provide a magnetron-type sputtering apparatus in which the on-off period of sputtering discharge, that is, the speed of deposition of a thin film composed of layers differing from each other in material, is controlled without putting an excessive electric load on the power supply of the apparatus, whereby the period of stratification can be made as small as 10 Å to several scores of 10 Å or less.

In the sputtering apparatus provided in accordance with the present invention, at least two different kinds of target are provided on a cathode side, a substrate, onto which sputtering is performed, is provided on an anode side, and magnetic field generating means is provided with which magnetic fields substantially perpendicularly intersecting electric fields generated between the substrate and the targets are generated near the front sides of the targets. The sputtering apparatus is characterized in that the magnetic field generating means include main magnets for generating the magnetic fields, and auxiliary electromagnets provided near the main magnets or combined therewith, wherein electrical currents for exciting the auxiliary electromagnets are controlled to charge the intensity of the magnetic fields to regulate sputtering discharge.

DESCRIPTION OF THE PREFERRED EMBODIMENTS

A preferred embodiment of the present invention is hereafter described with reference to the attached drawings.

Figure 1:
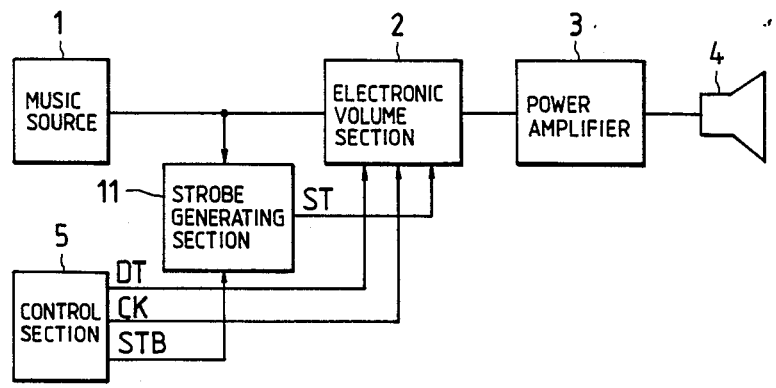
FIG. 1 shows a schematic view of a major portion of a sputtering apparatus constructed according to a preferred embodiment of the present invention.

FIG. 1 shows a schematic view of a major portion of a sputtering apparatus constructed in accordance with the invention. The apparatus has a vacuum vessel 10 which can be degassed to a desired pressure through a gas outlet port 11 by a vacuum pump or the like (not shown). An appropriate gas can be introduced into the vacuum vessel 10 through a gas inlet port 12.

Two targets 1A and 1B are provided on the cathode side in the vacuum vessel 10. A holder 7, to which a substrate 6 is removably attached facing the targets 1A and 1B, is provided on the anode side in the vacuum vessel 10. A power supply 8A is connected to the target 1A.

A magnetic field generator including a permanent magnet 3A, which is a main magnet, and an electromagnet 5A, which is an auxiliary magnet, is provided behind the target 1A opposite the anode side. The permanent magnet 3A generates a closed magnetic field Xa near the front side (the upper side in FIG. 1) of the target 1A The closed magnetic field Xa substantially perpendicularly intersects the electric field generated between the anode and cathode of the sputtering apparatus. The intensity of the magnetic field Xa can be changed by regulating the drive current to the electromagnet 5. The permanent magnet 3A has a peripheral magnetic pole extending along substantially the entire periphery of the target 1A, and a central magnetic pole located substantially at the center of the magnet, so that the closed magnetic field Xa is generated between the magnetic poles. The peripheral and the central magnetic poles are magnetically coupled to each other by a yoke 4A made of a soft magnetic material. The coil of the electromagnet 5A surrounds a portion of the yoke 4A, which projects and supports the central magnetic pole of the permanent magnet 3A. A power supply 9 for the electromagnet 5A can be controlled to alternate the intensity of the magnetic field Xa.

A magnetic field generator of the same construction and operation as the above-described magnetic field generator is provided behind the other target 1B. The latter magnetic field generator includes a permanent magnet 3B, which is a main magnet, an electromagnet 5B, which is an auxiliary magnet, and a yoke 4B.

The targets 1A and 1B are made of mutually different metals, namely, a transition element and a rare earth element. For example, the target 1A may be made of an iron-cobalt alloy, and the other target 1B of a neodymium-dysprosium alloy. Each of the targets 1A and 1B may be shaped as a disk, although the shape is not confined thereto.

The peripheral portion of each of the permanent magnets 3A and 3B does not need to monolithically extend along the periphery of the corresponding target, and the peripheral portion may be made of a plurality of columnar or prismatic magnets juxtaposed along the periphery.

Since the temperature of the targets 1A and 1B rises due to sputtering discharge, which lowers the efficiency of sputtering, a conventional arrangement for causing cooling water to flow under the targets is provided to reduce the rise in the temperature.

A conventional arrangement may be provided for causing cooling water to flow at the rear side of the substrate 6, on which a thin film is deposited by sputtering, or a conventional heater may be provided to cool or heat the substrate depending on the properties of the thin film.

The intensity of the magnetic fields generated by the permanent magnets 3A and 3B is high enough to magnetically saturate the targets 1A and 1B when no electrical current flows through the electromagnets 5A and 5B. It is important for the control of the sputtering discharge (magnetron discharge) that the density of the magnetic flux on a horizontal plane extending at a distance of 1 mm up from the front side (the upper side in FIG. 1) of each target be in a range of 80 to 800 gauss. If the density of the magnetic flux in the horizontal plane is less than 80 gauss, the sputtering discharge will not be maintained under a pressure of 20 m Torr or less. If the magnetic flux density in the horizontal plane is more than 800 gauss, the radius of cycloidal movement of electrons caused by the magnetic field will be too small to efficiently promote ionization to maintain a desirable rate of sputtering. Although the above-mentioned desirable range of the density of the magnetic flux on the horizontal plane varies depending on conditions such as the pressure and type of the gas of the atmosphere, the amount of the variation is small under ordinary sputtering conditions. Sputtering can be properly performed when the density of the magnetic flux in the horizontal plane is 80 to 800 gauss. It is preferable that the density of the magnetic flux in the plane be 100 to 600 gauss.

The direction of the electrical current which flows through each of the electromagnets 5A and 5B is set so as to reduce the intensity of the magnetic field generated by the corresponding permanent magnet 3A or 3B. The minimum intensity of the magnetic field, which is determined by both the permanent magnet and the electromagnet, is set so as to magnetically saturate the target and produce a leakage magnetic field Xb whose flux density in the hOrizontal plane is 50 to 100 gauss. If the intensity of the total magnetic field in the horizontal plane is 50 to 100 gauss, the sputtering discharge cannot be sustained when the pressure of the atmosphere in the vacuum vessel 10 is 20 m Torr or less. However, the sputtering discharge can be easily be sustained by increasing the intensity of the total magnetic field from the range of 50 to 100 gauss by 50 to 100 gauss, as shown at Xa in FIG. 1.

Figure 2:
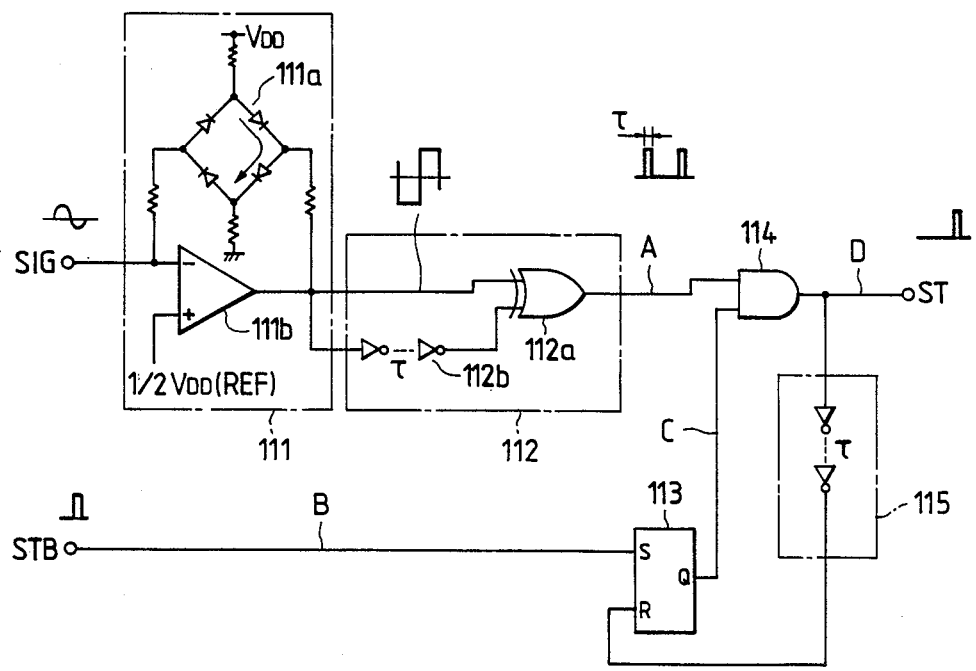
FIG. 2 shows the waveform of an electrical current for exciting the two electromagnets of the apparatus of FIG. 1.

It is important that the waveform of the electrical current which is caused to flow through each electromagnet 5A and 5B be sinusoidal and the current have an offset value $I_0$, as shown in FIG. 2. If the waveform is rectangular, the counterelectromotive force produced in the coil electromagnet will be so high as to likely damage the components of the power supply 9 for the electromagnet due to the resulting transient current. In a portion A (FIG. 2) of the period of the sine curve of the electrical current which flows through the electromagnet, the resultant magnetomotive force is sufficiently low that the sputtering discharge is turned off. In the other portion B of the period, the resultant magnetomotive force increases so that the sputtering discharge is turned on. Therefore, the turn-on and turn-off of the sputtering discharge can be controlled by optionally setting the period of the sine curve. Since the target to be subjected to sputtering is already magnetically saturated, even when the sputtering discharge remains turned off in the portion B, the electrical current for the electromagnet is still small until the sputtering discharge is turned on, and hence the load on the power supply for the electromagnet is made low. For the same reason, the sputtering discharge can be very easily switched between the on and the off states even if the period of turn-on and turn-off is short.

Figure 3:
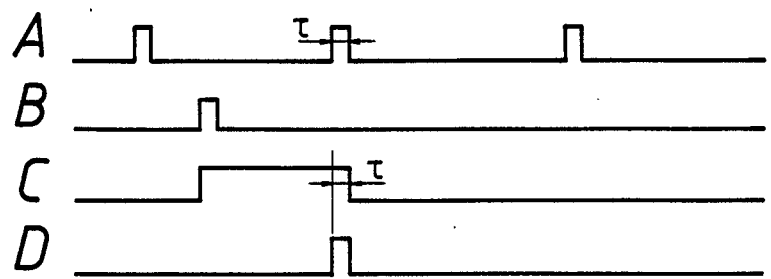
FIG. 3 shows the phase difference between the electrical currents for exciting the electromagnets of the apparatus.
Figure 4:
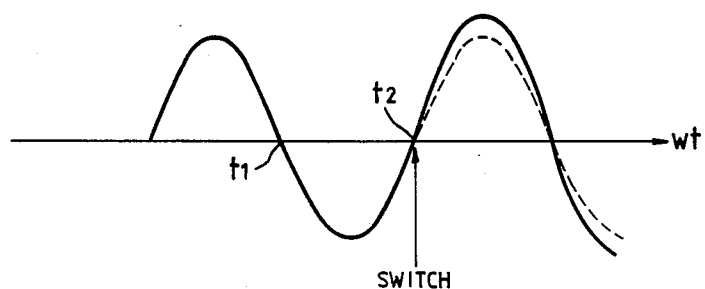
FIG. 4 shows a schematic view of a major portion of a conventional sputtering apparatus.
Figure 5:
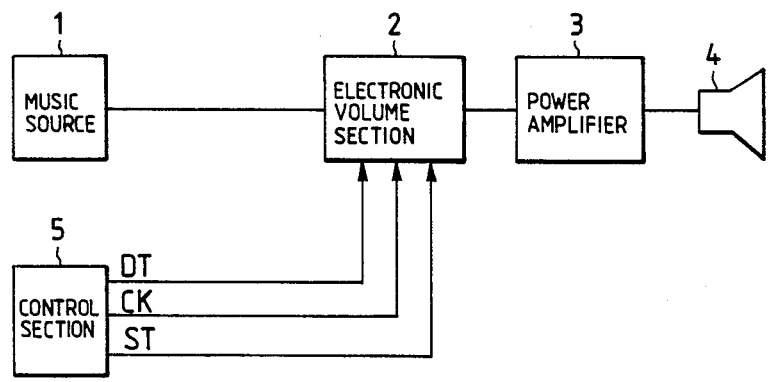
Figure 6:
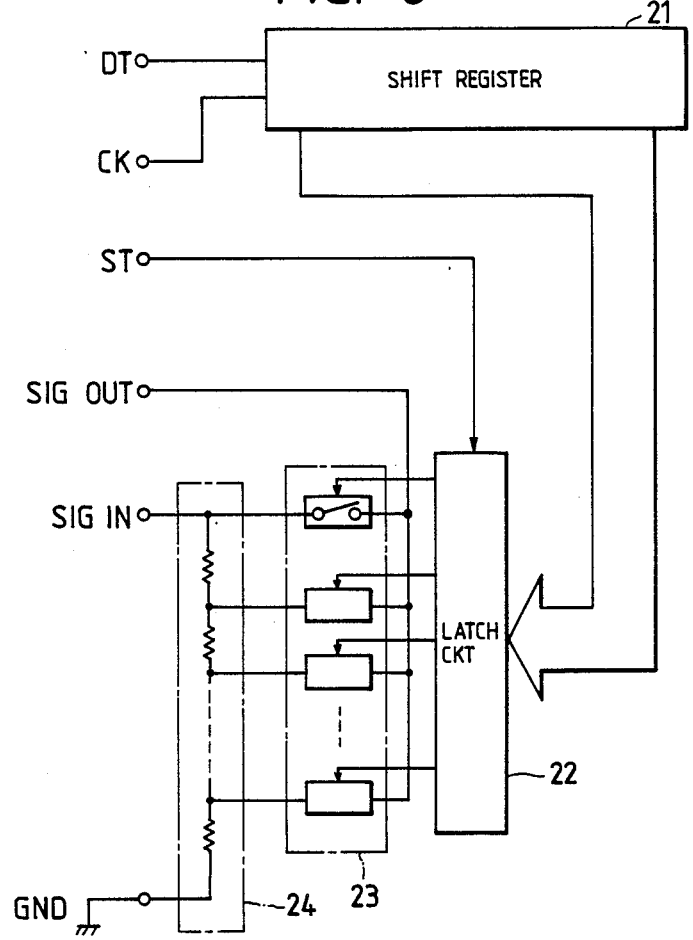
Figure 7:
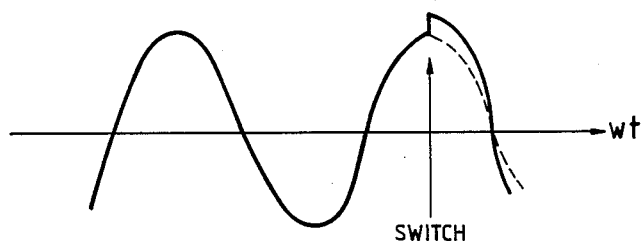
Figure 8:
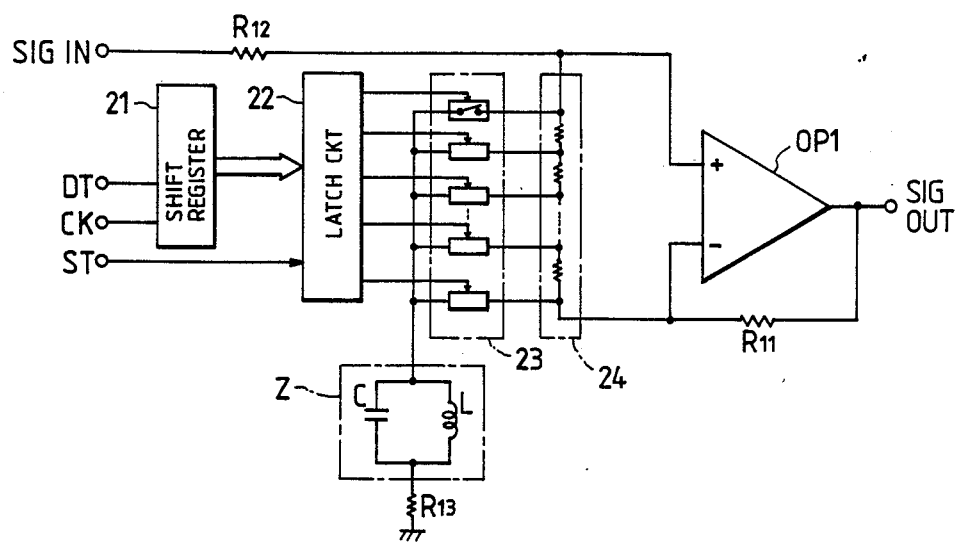
Figure 9:
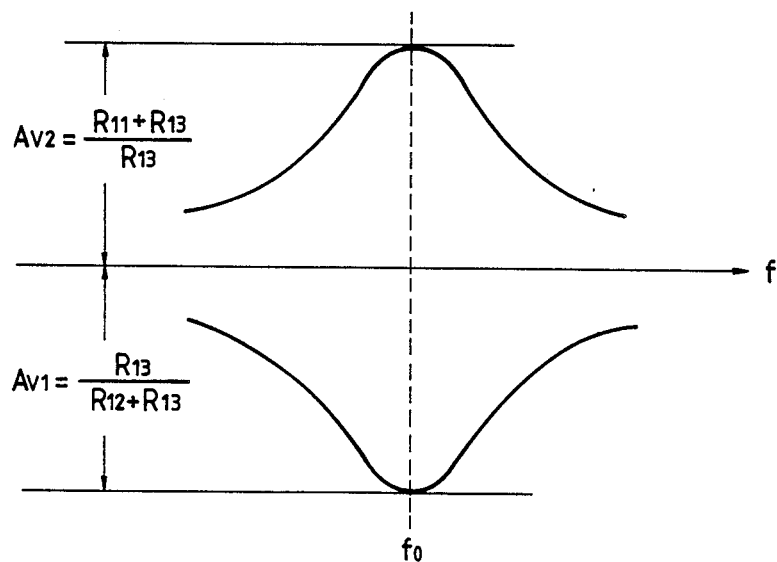

The electrical currents which flow through the electromagnets 5A and 5B are controlled through the power supply 9. The waveforms of the currents are determined so that the current $I_B$ for the electromagnet 5B flows through it at an appropriate timing, that is, at the time point immediately before the end of the sputtering discharge with the current $I_A$ for the electromagnet 5A, as shown in FIG. 3. As a result, the turn-on of the sputtering discharge is continually repeated at a very short period and stabilized. The discharge is performed above a boundary line y shown by a two-dot chain line in FIGS. 2 and 3. For these reasons, a thin film such as a film of stratified layers of gadolinium, dysprosium, iron and cobalt, the thickness of each layer of which is 10 Å to scores of 10 Å and corresponds to the very short period of the sputtering discharge, can be deposited on the substrate 6 by the inventive sputtering apparatus, although it is very difficult to deposit such a thin film in a conventional art Although permanent magnets are employed as the main magnets of the magnetic field generator in the above-described embodiment, the present invention is not confined thereto and may be otherwise embodied so that electromagnets are provided as the main magnets. Moreover, the positions of the electromagnets forming the auxiliary magnets of the magnetic field generator are not confined to those of the above-described embodiment, and may be appropriately altered.

In the sputtering apparatus provided in accordance with the present invention, permanent magnets and electromagnets are combined with each other as main and auxiliary magnets, and the electrical currents for exciting the electromagnets are controlled so that magnetic fields for causing sputtering discharge and other magnetic fields which will not cause a discharge are stably generated at a very short period. At a result, a thin film, which consists of stratified layers differing from each other in material and which has a smaller thickness than the thinnest film that can be deposited by a conventional sputtering apparatus, can be stably deposited without putting an undue load on a power supply as in the conventional sputtering apparatus.

What is claimed is:

1. A sputtering apparatus comprising: at least two different kinds of targets; a substrate, onto which sputtering is performed, disposed in opposition to said targets; magnetic field generating means for producing magnetic fields substantially perpendicularly intersecting electric fields generated between said substrate and said targets near front sides of said targets, said magnetic field generating means comprising main magnets for generating said magnetic fields, and respective auxiliary electromagnets provided near said main magnets or combined therewith; and means for supplying electrical currents for exciting said electromagnets and controlling said electrical currents to change the intensity of said magnetic fields to regulate a sputtering discharge, said electrical currents having a sinusoidal waveform with a DC offset.

2. The sputtering apparatus of claim 1, wherein the magnetic flux density in a horizontal plane extending at a distance 1 mm up from the front side of each of said targets is in the range of 80 to 800 gauss.

3. The sputtering apparatus of claim 1, wherein the magnetic flux density in a horizontal plane extending at a distance 1 mm up from the front side of each of said targets is in the range of 100 to 600 gauss.

4. The sputtering apparatus of claim 1, wherein said electrical currents are supplied in a direction to generate a magnetic field which reduces the total magnetic field produced by the combination of said electromagnets and said main magnets.

5. The sputtering apparatus of claim 1, wherein the minimum intensity of the magnetic field produced by each said main magnet and its corresponding electromagnet magnetically saturates the corresponding target and produces a leakage magnetic field whose flux density in a horizontal plane is in the range of 50 to 100 gauss.

* * * * *